(12) United States Patent
Orlovskaya et al.

(10) Patent No.: US 11,362,254 B2
(45) Date of Patent: Jun. 14, 2022

(54) THERMOELECTRIC POWER GENERATOR AND COMBUSTION APPARATUS

(71) Applicants: UNIVERSITY OF CENTRAL FLORIDA RESEARCH FOUNDATION, INC., Orlando, FL (US); Siemens Corporation, Princeton, NJ (US)

(72) Inventors: Nina Orlovskaya, Orlando, FL (US); Anthony Terracciano, Davie, FL (US); Arindam Dasgupta, Avon, CT (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 95 days.

(21) Appl. No.: 15/125,246

(22) PCT Filed: Mar. 11, 2015

(86) PCT No.: PCT/US2015/019916
§ 371 (c)(1),
(2) Date: Sep. 12, 2016

(87) PCT Pub. No.: WO2015/138583
PCT Pub. Date: Sep. 17, 2015

(65) Prior Publication Data
US 2017/0077376 A1    Mar. 16, 2017

Related U.S. Application Data

(60) Provisional application No. 61/950,891, filed on Mar. 11, 2014.

(51) Int. Cl.
*F23C 13/08* (2006.01)
*F01K 13/00* (2006.01)
(Continued)

(52) U.S. Cl.
CPC ............ *H01L 35/26* (2013.01); *F01K 13/006* (2013.01); *F02G 1/043* (2013.01); *F23C 13/08* (2013.01);
(Continued)

(58) Field of Classification Search
CPC ............ H01L 31/0468; H01L 31/0336; H01L 31/022475; H01L 31/022483; H01L 33/42;
(Continued)

(56) References Cited

U.S. PATENT DOCUMENTS 2,795,493 A * 6/1957 Gochoel .................. F23K 5/22
48/144
3,101,193 A * 8/1963 Varvel ................... F24H 3/0488
432/223

(Continued)

FOREIGN PATENT DOCUMENTS

| WO | 2005064698 A1 | 7/2005 |
| WO | 2006021009 A2 | 2/2006 |
| WO | 2010146569 A2 | 12/2010 |

OTHER PUBLICATIONS

Rachel Rosten "Characterization of (La0.9Sr0.1) 0.95Cr0.85Mg0.1 Ni0.05O3 Perovskite Ceramics for a Perovskite Related Membrane Reactor" Mater. Res. Soc. Symp. Proc. vol. 972 © 2007 Materials Research Society (Year: 2007).*
(Continued)

*Primary Examiner* — Michael Y Sun
(74) *Attorney, Agent, or Firm* — George McGuire

(57) ABSTRACT

A small-scale thermoelectric power generator and combustion apparatus, components thereof, methods for making the same, and applications thereof. The thermoelectric power generator can include a burner including a matrix stabilized combustion chamber comprising a catalytically enhanced,
(Continued)

porous flame containment portion. The combustion apparatus can include components connected in a loop configuration including a vaporization chamber; a mixing chamber connected to the vaporization chamber; a combustion chamber connected to the vaporization chamber; and a heat exchanger connected to the combustion chamber. The combustion chamber can include a porous combustion material which can include a unique catalytic material.

6 Claims, 9 Drawing Sheets

(51) Int. Cl.
| | | |
|---|---|---|
| *F02G 1/043* | (2006.01) | |
| *H01L 35/26* | (2006.01) | |
| *H01L 35/32* | (2006.01) | |
| *F23C 7/00* | (2006.01) | |
| *F23C 9/00* | (2006.01) | |
| *F23C 6/00* | (2006.01) | |
| *F23C 1/00* | (2006.01) | |
| *F01K 19/00* | (2006.01) | |
| *F25D 23/12* | (2006.01) | |
| *F22D 1/00* | (2006.01) | |

(52) U.S. Cl.
CPC .............. *H01L 35/32* (2013.01); *F01K 19/00* (2013.01); *F02G 2254/05* (2013.01); *F02G 2254/10* (2013.01); *F02G 2254/11* (2013.01); *F02G 2254/70* (2013.01); *F22D 1/003* (2013.01); *F23C 1/00* (2013.01); *F23C 6/00* (2013.01); *F23C 7/00* (2013.01); *F23C 9/00* (2013.01); *F23C 2900/13001* (2013.01); *F23C 2900/13002* (2013.01); *F23C 2900/99011* (2013.01); *F23M 2900/13003* (2013.01); *F24H 2240/127* (2013.01); *F25D 23/12* (2013.01); *G06F 2207/4913* (2013.01)

(58) Field of Classification Search
CPC ... H01L 31/072; H01L 33/0008; H01L 33/26; H01L 27/156; H01L 31/0224; H01L 29/06; H01L 31/05; H01L 31/0392; H01L 21/761; H01L 35/26; H01L 35/32; H05B 33/14; Y02E 10/50; F01K 13/006; F01K 19/00; F02G 1/043; F02G 2254/05; F02G 2254/10; F02G 2254/11; F02G 2254/70; F23C 13/08; F23C 1/00; F23C 6/00; F23C 7/00; F23C 9/00; F23C 2900/13001; F23C 2900/13002; F23C 2900/99011; F23M 2900/13003; F22D 1/003; F24H 2240/127; F25D 23/12; G06F 2207/4913
See application file for complete search history.

(56) References Cited

U.S. PATENT DOCUMENTS

| | | | | |
|---|---|---|---|---|
| 3,768,458 | A * | 10/1973 | Williams | F24H 1/08 122/18.3 |
| 3,881,962 | A | 5/1975 | Rubinstein | |
| 4,080,433 | A | 3/1978 | Whelan | |
| 4,081,519 | A | 3/1978 | Whelan | |
| 4,694,820 | A * | 9/1987 | Buckner | F23B 5/00 110/210 |
| 5,050,570 | A * | 9/1991 | Thring | F02B 75/16 123/556 |
| 5,477,676 | A * | 12/1995 | Benson | B64G 1/22 60/274 |
| 6,164,063 | A * | 12/2000 | Mendler | F01N 3/2882 60/274 |
| 6,338,248 | B1 * | 1/2002 | Waidner | F02G 1/055 60/521 |
| 6,393,824 | B1 * | 5/2002 | Kirner | F02G 1/043 60/784 |
| 7,493,766 | B2 | 2/2009 | Yang et al. | |
| 8,227,373 | B1 | 7/2012 | Azad et al. | |
| 9,566,562 | B1 * | 2/2017 | Quadir | C01B 39/02 |
| 2003/0196610 | A1 * | 10/2003 | Hughes | F24H 9/2035 122/155.2 |
| 2005/0016489 | A1 * | 1/2005 | Endicott | F02F 1/20 123/193.2 |
| 2010/0326076 | A1 * | 12/2010 | Ast | F01K 23/04 60/671 |
| 2012/0052002 | A1 | 3/2012 | Lee et al. | |
| 2012/0260962 | A1 * | 10/2012 | Caroff | C01B 3/323 136/205 |
| 2013/0145763 | A1 * | 6/2013 | Mirmobin | F01K 25/08 60/671 |
| 2013/0220115 | A1 * | 8/2013 | Kantola | F16J 1/006 92/187 |
| 2013/0292951 | A1 * | 11/2013 | Eckert | F01K 15/02 290/1 A |
| 2013/0312316 | A1 * | 11/2013 | Stites | C10L 1/02 44/266 |
| 2014/0087210 | A1 * | 3/2014 | Keane | B22F 3/02 428/810 |
| 2014/0199226 | A1 * | 7/2014 | Orlovskaya | C30B 1/10 423/289 |
| 2014/0323598 | A1 * | 10/2014 | Chakravarti | B01J 19/2475 518/703 |

OTHER PUBLICATIONS

International Search Report and Written Opinion Form PCT/ISA/210, International Application No. PCT/US2015/019916, pp. 1-13, International Filing Date Mar. 11, 2015.

\* cited by examiner

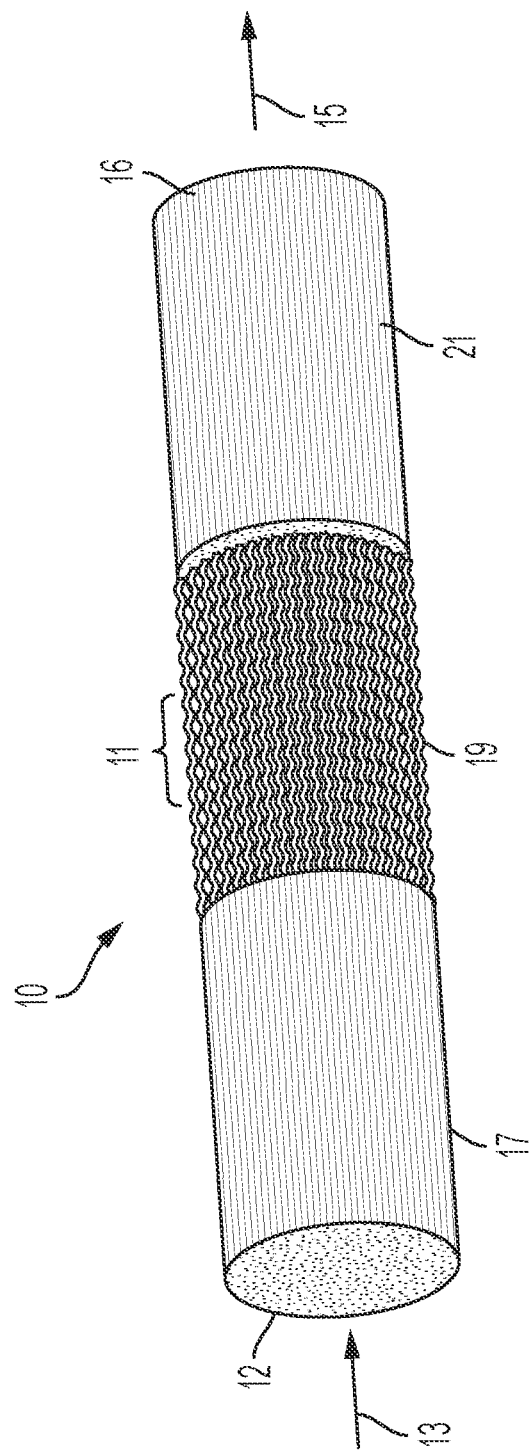

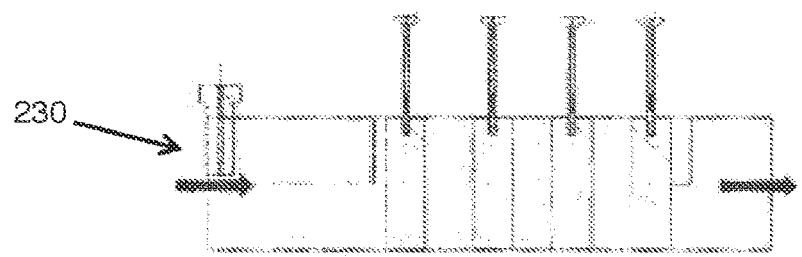
FIG. 8A
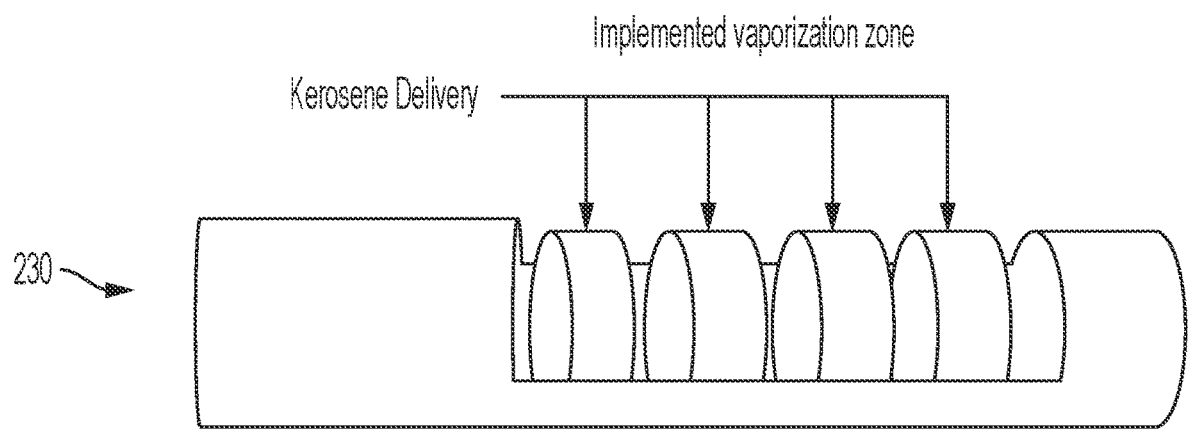
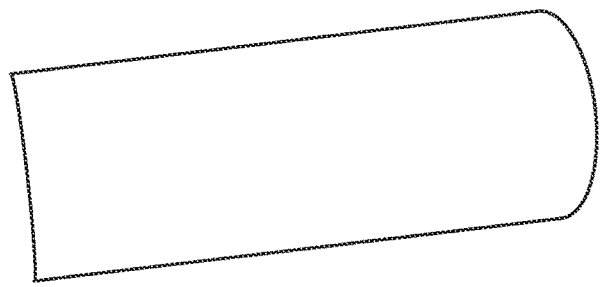
FIG. 8B

THERMOELECTRIC POWER GENERATOR AND COMBUSTION APPARATUS

RELATED APPLICATION DATA

The present application claims priority to and the benefit of U.S. provisional patent application No. 61/950,891, filed on Mar. 11, 2014, the entire contents of which are hereby incorporated by reference.

FIELD OF THE INVENTION

The present disclosure is directed generally to thermoelectric generators (TEG) and combustion apparatuses, and more particularly, to thermoelectric generators and combustion apparatuses including combustion chambers with catalytically enhanced porous portions.

BACKGROUND

With the advancement of technology in both the developing and developed world, it is becoming more evident that the low lifetime, low energy density, and somewhat limited accessibility of traditional batteries limits the applications of portable electronic devices. Hydrocarbon fuels are readily available in most societies and have a much higher energy density than traditional batteries, thus making them a very attractive resource for man-portable power generation applications. This has led to a large amount of research put into man-portable power generators within the past two decades. Today's traditional small-scale electric generators have already proven to be useful for applications such as camping, military use, and natural disaster aid. However, these electric generators are based on engines, which are noise-polluting machines. In addition, engine components have limited lifetimes due to wear, and thus must be continuously replaced throughout the engine's lifetime. These two flaws have led to a field of research efforts put into solid-state power generators.

Currently, two solid-state technologies are attempting to claim the niche of hydrocarbon-fueled man-portable solid-state power generation. Those include fuel cells and thermoelectric generators. For man-portable solid state power generation applications, fuel cell systems have been shown to be more complex and expensive than thermoelectric generator systems. In addition, thermoelectric generators can produce power from any heat source and thus any fuel-type, while fuel cells can only be fueled by a select group of fuels. However, neither of the conventional fuel cells and thermoelectric generators is sufficiently efficient for the purpose of man-portable solid-state power generation. Further, for man-portable solid state power generation applications, fuel cell systems have been shown to be more complex and expensive than thermoelectric generator systems.

Research illustrates various methods of supplying liquid fuel to porous media burners. One methodology requires the use of ultrasonic oscillating fuel injectors. While this method and apparatus is accurate, it can cost upwards of $6,000 for the apparatus as a purchased package, and the nozzle can be easily damaged due to external vibrations. Another more practical method of supplying kerosene to a porous burner is to drop a controlled amount of kerosene onto a wire mesh, which is supplied radiant heat from a downstream combustion chamber. There are several drawbacks for this proposed method, such as a vertical screen drop method requires heat from the combustion section to heat the screens, reducing the efficiency of the combustion reaction. This type of design also requires the burner to be extremely large in one dimension and allows for a vertical operation only.

Accordingly, there is a need in the art for a better and more efficient man-portable thermoelectric generator system/device, and for a better and more efficient porous media burner/combustion apparatus and method of supplying liquid fuel to the porous media burner.

SUMMARY OF THE INVENTION

The present disclosure is directed to an inventive structure, configuration, and resulting function thermoelectric generators and combustion apparatuses including combustion chambers with catalytically enhanced porous portions. Various embodiments and implementations herein are directed to a thermoelectric generator including a burner with a matrix stabilized combustion chamber including a catalytically enhanced, porous flame containment portion that can use both oxide and non-oxide ceramics as the catalytic enhancement. Additional embodiments can include a combustion apparatus with the following components in a loop configuration: a vaporization chamber; a mixing chamber connected to the vaporization chamber; a combustion chamber connected to the vaporization chamber; and a heat exchanger connected to the combustion chamber, where the combustion chamber includes a porous combustion material including a catalytic material including unique ceramic catalysts.

Using the various embodiments and implementations herein, the thermoelectric generators and combustion apparatuses can be well-suited as a portable heater and an electrical power generator for several applications. Where batteries are hard to obtain in some areas (e.g., due to budget constraints and/or shipping constraints (for remote locations)), the portable thermoelectric generators and combustion apparatuses of an embodiment can be easy to assemble and start using. Thus, thermoelectric generators and combustion apparatuses of an embodiment well-suited for long-to-medium duration usage in remote environments (environments that do not have access to convenient shipping/purchasing methods of rechargeable batteries) where there is a reliable propane supply or enough storage space to house a large amount of propane; and either the inability to pay for a bundle of batteries with the same energy capacity or the inability to obtain a bundle of batteries with the same energy capacity. Some examples of these environments include: off-shore oil rigs, developing countries, natural disaster areas.

Additionally, for any military or civilian habitation, the access to clean water is a paramount necessity. According to the Center for Disease Control, boiling water for three minutes will render any biological agent inert. The use of a porous media burner/combustion apparatus of an embodiment powered by kerosene, or other liquid logistic fuel can provided inexpensive and efficient means of producing potable water. Kerosene being a liquid logistic fuel readily available fuel in the military, as well as foreign or domestic markets, can easily be used to power a thermal energy source, thus allowing widespread implementation of porous media burner/combustion apparatus of an embodiment utilizing liquid logistic fuels as a heat source for water purification, while simultaneously providing the necessary thermal gradient for thermoelectrics. Kerosene can also provide an effective utilitarian value for the heating of portable dwellings and to remove moisture from wet clothing. The use of an efficient kerosene powered device can greatly reduce the long term operating costs of such facilities. Further use of a porous media burner/combustion apparatus of an embodiment can also provide a cost effective method of supplying heat for portable HVAC systems which fall under the military FOSH (family of space heaters) designation, or for the implementation of similar components in recreational vehicles.

Generally in one aspect, a thermoelectric generator is provided and includes, but is not limited to: a burner including a matrix stabilized combustion chamber comprising a catalytically enhanced, porous flame containment portion.

In accordance with an embodiment, the matrix stabilized combustion chamber is a shape selected from the group consisting of elliptically shaped and cylindrically-shaped.

In accordance with an embodiment, the catalytically enhanced, porous flame containment portion includes a reticulated foam portion comprising a refractory ceramic.

In accordance with an embodiment, the refractory ceramic is selected from the group consisting of silicon carbide (SiC) reticulated foam and alumina ($Al_2O_3$) reticulated foam.

In accordance with an embodiment, the refractory ceramic has a surface coated with a catalytically active material selected from at least one of $La_xM_{(1-x)}CoO_3$, $La_xM_{(1-x)}MnO_3$, or gadolinia doped cerin (20 mol % $Gd_2O_3$—$CeO_2$), wherein M comprises a transition metal or a rare-earth metal.

In accordance with an embodiment, $La_xM_{(1-x)}CoO_3$ is lanthanum cobaltite ($La_{0.6}Sr_{0.4}CoO_3$).

In accordance with an embodiment, $La_xM_{(1-x)}MnO_3$ is lanthanum manganite ($La_{0.7}Sr_{0.3}MnO_3$).

In accordance with an embodiment, the refractory ceramic has a surface coated with a catalytically active material selected from at least one of $Zr_xM_{(1-x)}B_2$ and tungsten carbide (WC), wherein M comprises a transition metal or a rare-earth metal.

In accordance with an embodiment, the $Zr_xM_{(1-x)}B_2$ is zirconium diboride ($ZrB_2$).

In accordance with an embodiment, the thermoelectric generator further includes a thermally conductive casing comprising a first side and a second side and encompassing the catalytically enhanced, porous flame containment portion of the matrix stabilized combustion chamber.

In accordance with an embodiment, the thermoelectric generator further includes a first heat sink positioned adjacent to the first side of the thermally conductive casing.

In accordance with an embodiment, the thermoelectric generator further includes a first thermoelectric module stack comprising a first thermoelectric module and a second thermoelectric module positioned between the first heat sink and the first side of the thermally conductive casing, wherein the first thermoelectric module is positioned closer to the first side of the thermally conductive casing and has a higher optimum operating temperature as compared to the second thermoelectric module.

In accordance with an embodiment, the thermoelectric generator further includes a second heat sink positioned adjacent to the second side of the thermally conductive casing.

In accordance with an embodiment, the thermoelectric generator further includes a second thermoelectric module stack comprising a third thermoelectric module and a fourth thermoelectric module positioned between the second heat sink and the second side of the thermally conductive casing, wherein the third thermoelectric module is positioned closer to the second side of the thermally conductive casing and has a higher optimum operating temperature as compared to the fourth thermoelectric module.

In accordance with an embodiment, the burner is configured or structured to utilize unpressurized ambient air as an oxidizer.

Generally in another aspect, a combustion apparatus is provided and includes, but is not limited to, a porous combustion material comprising a catalytic material selected from the group consisting of: $OsB_2$, $IrB_2$, $ReB_2$, $OsB_{12}$, $IrB_{12}$, $ReB_{12}$ and alloys of $OsB_2$, $IrB_2$, $ReB_2$, $OsB_{12}$, $IrB_{12}$, $ReB_{12}$; $AlMgB_{14}$, $AlCrB_{14}$, $AlCoB_{14}$, $AlMnB_{14}$, and alloys of $AlMgB_{14}$, $AlCrB_{14}$, $AlCoB_{14}$, $AlMnB_{14}$; $WB_4$; and $La_uSr_vCr_wMg_xNi_yO_z$ ceramic materials, where u equals 0.6 to 0.8, v equals 0.2 to 0.4, w equals 0.7 to 0.8, x equals 0.195 to 0.295, y equals 0.001 to 0.005 and z equals 2.95 to 3.05.

In accordance with an embodiment, the combustion apparatus includes a portable stove.

In accordance with an embodiment, the combustion apparatus comprises a portable space heater.

In accordance with an embodiment, the combustion apparatus comprises a Stirling engine.

In accordance with an embodiment, the combustion apparatus comprises an Organic Rankine Cycle.

In accordance with an embodiment, the combustion apparatus comprises a portable water heater.

Generally in another aspect, a combustion apparatus is provided and includes, but is not limited to, a number of components connected in a loop configuration including a vaporization chamber; a mixing chamber connected to the vaporization chamber; a combustion chamber connected to the vaporization chamber; and a heat exchanger connected to the combustion chamber.

In accordance with an embodiment, the vaporization chamber includes a porous metal evaporator component to which heat is supplied providing for controlled vaporization of liquid fuel prior to reaching the combustion chamber.

In accordance with an embodiment, the combustion chamber comprises a porous combustion material.

In accordance with an embodiment, the porous combustion material includes a catalytic material.

In accordance with an embodiment, the catalytic material is selected from the group consisting of: $OsB_2$, $IrB_2$, $ReB_2$, $OsB_{12}$, $IrB_{12}$, $ReB_{12}$ and alloys of $OsB_2$, $IrB_2$, $ReB_2$, $OsB_{12}$, $IrB_{12}$, $ReB_{12}$; $AlMgB_{14}$, $AlCrB_{14}$, $AlCoB_{14}$, $AlMnB_{14}$, and alloys of $AlMgB_{14}$, $AlCrB_{14}$, $AlCoB_{14}$, $AlMnB_{14}$; $WB_4$; and $La_uSr_vCr_wMg_xNi_yO_z$ ceramic materials, where u equals 0.6 to 0.8, v equals 0.2 to 0.4, w equals 0.7 to 0.8, x equals 0.195 to 0.295, y equals 0.001 to 0.005 and z equals 2.95 to 3.05.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIG. 1 a perspective side view schematic representation of a porous burner with a matrix stabilized porous medium in accordance with an embodiment.

FIG. 8A is a 2D model schematic representation of a vaporization zone in accordance with an embodiment.

FIG. 8B is a photographic representation of a vaporization zone in accordance with an embodiment.

DETAILED DESCRIPTION OF EMBODIMENTS

Figure 2A:
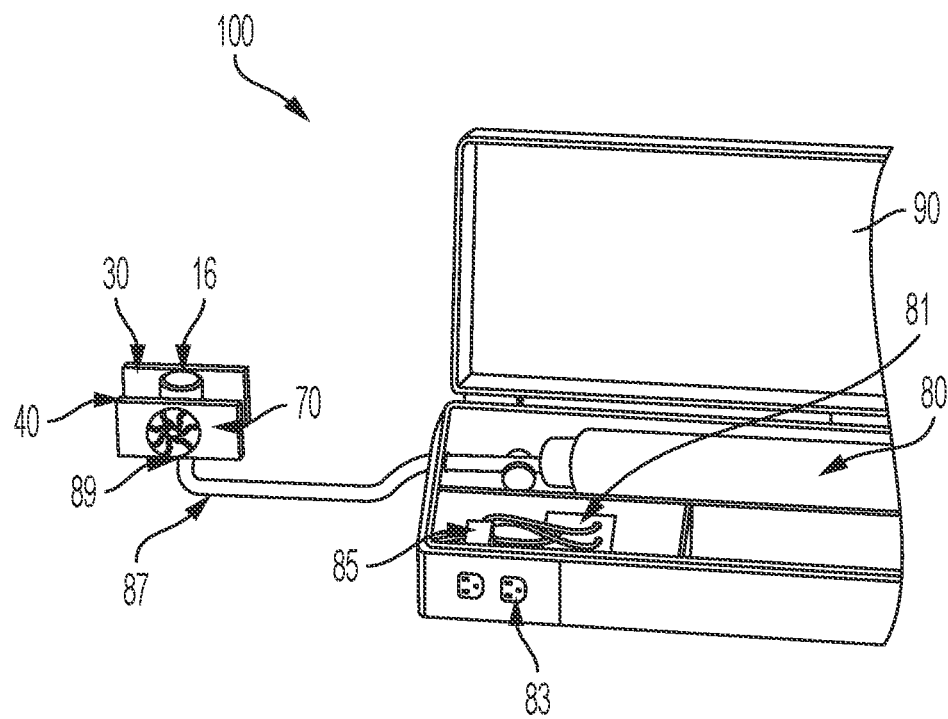
FIG. 2A is a perspective view of a man-portable thermoelectric power generator in an "operation mode" in accordance with an embodiment.

The present disclosure describes various embodiments of an improved thermoelectric generator and combustion apparatus for use as a man-portable solid-state power generation device. More generally, Applicants have recognized and appreciated that thermoelectric generators can be configured to produce power from any heat source and thus any fuel-type, while fuel cells can only be fueled by a select group of fuels; and a main advantage of an embodiment of the thermoelectric power generator over other conventional power generators is that an embodiment of the thermoelectric power generator be configured to provide a higher power density and energy density (see Table 1, below) than conventional man-portable solid-state power generation devices, due to having a higher system efficiency (the main contributor of this system efficiency gain is the gain in combustion efficiency due to the incorporation of a thermally conductive porous medium in the combustion chamber, the gain in chemical-to-thermal efficiency due to the geometry and material of the combustor casing, and the gain in TEG efficiency due to the material of the combustor casing.). The thermoelectric generator system of an embodiment (as described herein) can feature an air-breathing matrix-stabilized porous-medium combustor, which is an adaptation of traditional matrix-stabilized porous-medium combustor in that it utilizes the surrounding air as its oxidizer via a suction effect created from the upstream energy of the combustor's flame. Due to the extremely high efficiency of a matrix-stabilized porous-medium combustor of an embodiment, the small-scale thermoelectric power generators based upon matrix-stabilized porous-medium combustion of an embodiment have much higher efficiencies than the traditional small-scale thermoelectric power generators (those based upon open-flame combustion). This is because traditional small-scale thermoelectric power generators use an open-flame for combustion, which causes much more loss than that of matrix-stabilized porous-medium combustion. Coupled to a combustor, a matrix-stabilized porous-medium combustor system can incorporate standard Bismuth Telleride thermoelectric generators coupled to fan-cooled aluminum plate-fin heat sinks.

Additionally, Applicants have recognized and appreciated that matrix-stabilized porous-medium burner technology is an advanced combustion system and method, in which a mixture of fuel and oxidizer is burned within a solid porous medium providing the conditions where very lean gases can be combusted. The process is called super-adiabatic combustion. The porous medium provides heat transfer where the high temperature combustion products in the post flame zone heat the upstream porous solid by radiation and conduction which, in turn, heats the incoming reactants. The process results in a flame temperature higher than the equilibrium adiabatic value achievable by the fuel. The very large surface area to volume ratio maximizes the contact of the solid with the gas, thus maximizing the heat transfer between gas and solid. The high thermal conductivity and high thermal capacity of the solid facilitates the heat transfer mechanism through the solid matrix that does not exist in a typical gas burner. The heat transfer is further enhanced by two factors: first, the dispersion of the reactants flowing through the porous medium and second, the mixing due to turbulence from small vortices of gas generated by the solid medium. It is preferable that the porous medium have good thermal mechanical strength and superior thermal shock resistance to endure creep and thermal cycling during combustion.

Applicants have further recognized and appreciated that porous burner technology has a clear advantage over typical gas burners since the feedback heat transfer enables ultra-fuel-lean mixtures and low calorific value gases to be burned. It is also a very safe technology because the mixture is so fuel-lean it cannot burn outside the porous medium. Among possible practical applications of porous burner technology are power generation via thermoelectric devices, small scale heating purposes and combustion of low calorific value landfill seepage gases. Special considerations should be made to the configuration design and material selection for the porous burner to avoid easy degradation and to maximize the heat transfer capabilities. Good heat transfer properties of the solid medium allows burning of lean mixtures and maintains a low maximum flame temperature, which helps to reduce NOx emissions, and help keep a homogeneous temperature field over the length of the medium allowing time for CO oxidation which is directly related to prevention and control of air pollution.

Applicants have also recognized and appreciated that the combustion process of matrix-stabilized porous-medium burner technology involves several aspects which have been specifically optimized for a small-scale high-power-density application. Firstly, the high combustion efficiency enables low fuel usage and thus a smaller required fuel tank size. Secondly, the burner hosts an air-breathing flame, thus eliminating the need to attain air from a large and heavy compressed air tank. Although operating with air at atmospheric pressure does correspond to having a lower combustion efficiency than that of a combustor using compressed air, this sacrifice allows for a much higher energy density than that of a thermoelectric power generator system that incorporates compressed air tanks. Thermally conductive porous materials have shown to enable extremely efficient combustion reactions termed super-adiabatic. By using a porous matrix as a multimode heat transfer medium in a combustion chamber, supplementary heat from reaction products can be transferred to reactants, thus enabling leaner fuel mixtures to be burned, higher flame temperatures to be reached, and reduced enthalpy losses (lower exhaust temperature) than standard combustion processes. This heat recirculation process also allows leaner combustion. By using the waste heat of the burner's exhaust as an energy source, thermoelectric generators will provide a reliable and low-maintenance source of electricity since they operate without any moving parts. Thermoelectric devices operate by utilizing the Seebeck effect: a temperature gradient across two joined conducting materials will create a voltage. To optimize the voltage output for any given application, a thermoelectric device with the highest possible efficiency will be chosen for the specific temperature application. The power output can be increased by cooling the cool-side of the device with a heat sink. In addition, it is standard to connect multiple thermoelectric devices together in series to increase the power output.

Additionally, in another related arrangement, Applicants have also recognized and appreciated that the inexpensive and efficient heat generation by using super-adiabatic combustion in porous ceramic media/combustion apparatus utilizing liquid logistic fuel, such as kerosene or another liquid logistic fuel is possible by utilizing an embodiment. The uniqueness of an embodiment of the porous ceramic media/combustion apparatus includes, but is not limited to, the special design of the fuel evaporation system using metallic porous media with a high specific surface area as well as the utilization of different catalysts to promote lean combustion at low temperatures producing low amounts of NOx is also realized. The use of a metallic porous media that is convectively heated due to incoming air exposure to waste heat from the exhaust gasses in an embodiment, allows greater flexibility in the manner which a system can be oriented and reduces the one obscure dimension to something more uniform to the burner itself.

A particular goal of utilization of the embodiments of the present disclosure is the ability of the embodiments of the improved thermoelectric generator to convert heat directly into electricity by means of the thermoelectric effect without the reliance on moving parts, thermoelectric generators offer a high-power-density, low-noise, low-maintenance, relatively low cost (compared to fuel cells) and reliable solution for small-scale power generation. In addition, the flat shape of thermoelectric generators makes them ideal for high-power-density applications. Another particular goal of utilization of the embodiments of the present disclosure is the ability of the embodiments of the combustion apparatus to provide certain benefits of catalytically promoted combustion. These benefits include an extremely low amount of NOx production, due to the fact that the reaction is catalytic and there are preferably no high temperature flame zones where NOx is typically produced. Simultaneously, there can be a dramatic reduction in the amount of unburned carbon and partially oxidized carbon, i.e., due to the catalytic drive of the combustion reaction to full completion.

In view of the foregoing, various embodiments and implementations are directed to a man-portable thermoelectric power generator system including a burner with a matrix stabilized combustion chamber including a catalytically enhanced, porous flame containment portion, that can use both oxide and non-oxide ceramics as the catalytic enhancement. The system can integrate an air-breathing matrix-stabilized porous-medium combustor, which utilizes the surrounding air as its oxidizer via a suction effect created from the upstream energy of the combustor's flame. Additional embodiments can include a porous super adiabatic combustion apparatus designed and developed to efficiently produce inexpensive heat by burning lean fuel mixtures composed of liquid fuels and air. The unique design for the fuel vaporization chamber component, for example, is provided where highly porous metallic foams with high specific surface are used to facilitate the liquid fuel vaporization and fast transportation to the mixing chamber. Once the fuel is mixed with an oxidant and transported to the combustion zone inside the porous media, the combustion can be promoted by efficient novel ceramic catalysts.

Man-Portable Thermoelectric Power Generator

In accordance with an embodiment, a small-scale thermoelectric power generator 100, components thereof, methods for making, and applications thereof are described below. An application of the disclosed small-scale thermoelectric power generator 100 is for powering small-scale electronic devices. The disclosed small-scale thermoelectric power generator 100 uses the thermoelectric effect to convert heat energy into electrical energy without the reliance on moving parts. A component burner contains thermally conductive porous materials. By using a porous matrix as a multimode heat transfer medium in a combustion chamber, supplementary heat from reaction products can be transferred to reactants, which allows leaner combustion, reduced pollutant emissions, and super-adiabatic flame temperatures. A porous surface of the burner is catalytically enhanced by a coating of an oxide or non-oxide ceramic. A prototype small-scale thermoelectric power generator can be lightweight (4-6 lb), small enough to fit in a small carrying case (150-200 in$^3$ storage volume), and capable of generating 25-30 W of steady electricity for 15-20 hours without refueling.

Referring to FIG. 1, in one embodiment, a perspective side view schematic representation of a porous burner with a matrix stabilized porous medium 10 is provided. More particularly, the porous burner with a matrix stabilized porous medium 10 can include, but is not limited to, two lower porosity honeycomb portions 17, 21, and a stabilized flame zone portion 11 (where a flame can be stabilized and localized within a cylindrical matrix structure) with a higher porosity foam 19 positioned between the two lower porosity honeycomb portions 17, 21. Premixed reactants 13 can be fed in one end 12 of the porous burner 10 and combustion products 15 can exit the opposite end at an exhaust outlet 16 of the porous burner 10.

Referring to FIG. 2A, in one embodiment, a perspective view of a man-portable thermoelectric power generator 100 in an "operation mode" (i.e., parts of the components are outside of the case 90, and are operational) is provided. The man-portable thermoelectric power generator 100 can include, but is not limited to a combustion chamber casing 30 that encompasses at least a part of the porous burner with a matrix stabilized porous medium 10, where the exhaust outlet 16 is shown. The combustion chamber casing 30 can be flanked on opposite sides by at least one thermoelectric module (TEG) stack 40 (There are two stacks of thermoelectric modules shown on each side of the combustion chamber casing 30 in this and other Figures described herein, where each stack includes three modules. It is contemplated that any number of stacks and modules contained within the stacks can be provided.). Two heat sinks 70

Figure 2B:
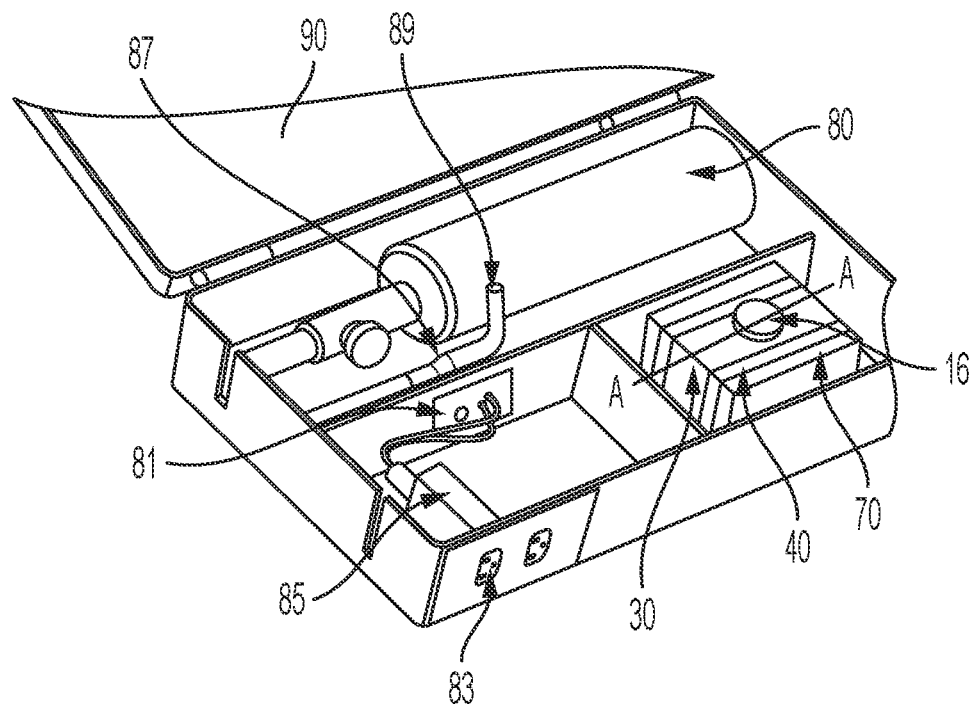
FIG. 2B is a perspective view of the man-portable thermoelectric power generator shown in FIG. 2A in a "storage mode" in accordance with an embodiment.

(preferably with a fan incorporated) are shown, each of which is positioned adjacent to the side of the thermoelectric module stack(s) 40 opposite the combustion chamber casing 30. A fuel tank 80 (e.g., propane, and preferably with a pressure regulator incorporated), a DC booster circuit 81, an AC electrical outlet 83, and invertor 85 are shown within a carrying case 90. An air inlet is shown extending from the carrying case 90 and attached to a torch head, which is attached to the combustion chamber casing 30. FIG. 2B shows the same components of the man-portable thermoelectric power generator 100 as shown in FIG. 2A, except that the components in FIG. 2B are in a "storage mode" inside of the case 90.

Figure 3A:
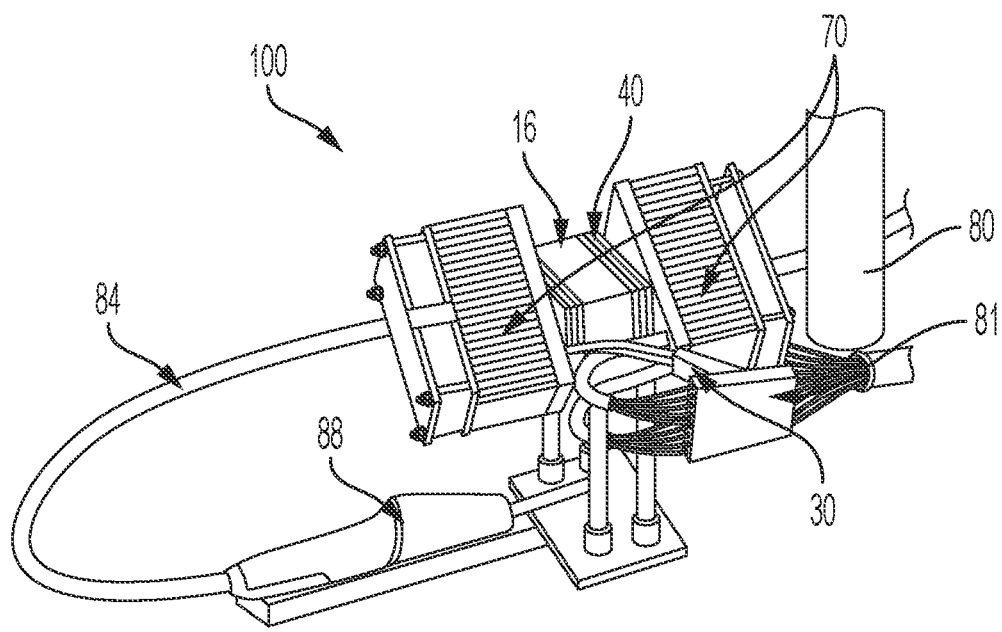
FIG. 3A is a perspective view of a man-portable thermoelectric power generator in an "operation mode" in accordance with an embodiment.
Figure 3B:
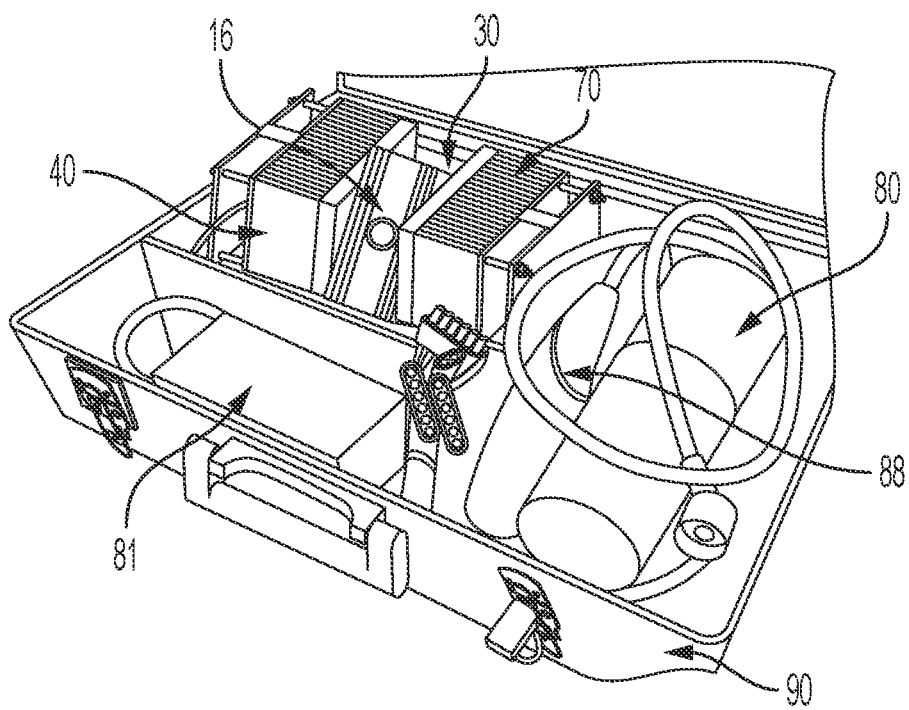
FIG. 3B is a perspective view of the man-portable thermoelectric power generator shown in FIG. 2A in a "storage mode" in accordance with an embodiment.

Referring to FIG. 3A, in another embodiment, a perspective view of a man-portable thermoelectric power generator 100 in an "operation mode" (i.e., parts of the components are outside of the case 90, and are operational) is provided (which is similar to the man-portable thermoelectric power generator 100 shown in FIG. 2A. For example, a combustion chamber casing 30 is shown and encompasses at least a part of the porous burner with a matrix stabilized porous medium 10, where the exhaust outlet 16 is also shown. Four thermoelectric module (TEG) stacks 40 are shown, each of which includes three thermoelectric modules (which are described further below). Two heat sinks 70 (preferably with a fan incorporated) are shown, each of which is positioned adjacent to the side of the thermoelectric module stacks 40 opposite the combustion chamber casing 30. A torch 88 connected to a propane fuel tank 80 via a hose 84, and circuitry 81 are also shown. FIG. 3B shows the same components of the man-portable thermoelectric power generator 100 as shown in FIG. 3A, except that the components in FIG. 3B are in a "storage mode" inside of the case 90.

In accordance with an embodiment, additional non-limiting details regarding the non-limiting components of the man-portable thermoelectric power generator 100 are set forth herein below. The carrying casing 90 can be a compact case limited on minimum dimensions by the dimensions of the man-portable thermoelectric power generator 100 and the 16.92 oz. propane tank, as shown in FIGS. 2B and 3B. The case 90 can have a briefcase look, and can be made of lightweight aluminum, but it could easily be made of a cheaper metal like steel, or a polymer. The D/C to A/C circuit 81 can convert the direct current power output of the thermoelectric modules, regulate it, and convert it to a 120 volt standard A/C output that is standard in the U.S. The fuel hose 84 can be a 5-foot hose, or of any other practical length for maximum mobility and accessibility. It is connected to a pre-swirl torch burner 88 with an igniter incorporated. The torch outlet 89 is pressure-regulated to burn at different flame speeds. The torch's stainless steel burn tube is constructed for durability and long-term usage. All of these parts can be standard in industry and easily replaceable. The fuel tank 80 can be, for example, an industry standard 16.92 oz. propylene or propane fuel cylinder; it is replaceable, recyclable and contains a total of 22.27 mega joules of energy. The exhaust pipe 16 serves to eliminate flame propagation outside the combustor. As matrix-stabilized combustion can be a rather unstable process, this mechanism can be important for maintaining safe operation conditions.

The fan powered heat sinks 70 can cool the "cold" side of the thermoelectric module stacks 40 by increasing the surface area where the heat can be dissipated by convection. The fan increases the convection coefficient of the heat sink 70 surfaces, thus effectively increasing their cooling capability. The heat sinks 70 can preferably be made of aluminum because of the low thermal resistance of the material and its light weight. This preferred setup is designed to increase the power output of the thermoelectric module stacks 40 (and individual modules), the extra cooling gain from the increased convection caused by the fans, and increases the power output of the thermoelectric module stacks 40 (and individual modules).

The thermoelectric modules are placed in between the combustion chamber's casing 30 and the heat sinks 70. The thermoelectric modules take advantage of the temperature difference between the heat sinks 70 and the combustion chamber 5 (shown in FIG. 4) within the casing 30 to produce an electromotive force to generate power. There are four stacks of three thermoelectric modules as seen in FIG. 3A. Each thermoelectric module can have an optimum operating temperature; in each stack 40 the modules designed to operate on the highest temperature are placed closest to the combustion chamber 5 within the casing 30. The modules that have a lower optimum operation temperature are closer to the heat sink 70. All the modules can be connected in series and in parallel, and the added D/C power is fed to the D/C-to-A/C circuit 81.

The combustion chamber casing 30 geometry can be engineered to have a large TEG surface area-to-volume ratio (thus to maximize power density), a homogeneous temperature distribution that is equal to the maximum allowable temperature of the thermoelectric devices (thus to maximize TEG efficiency and minimize heat lost through the exhaust), and small inner/chamber volume (i.e. a small-sized combustion chamber) with respect to its outer volume (thus to optimize the system's chemical-to-thermal efficiency). The casing 30 features a long rectangular cross-section at its exterior and a small cylindrical cross-section at its interior; using this combination of geometries with a thermally conductive material (which can maximize the use of the heat generated from combustion by reducing enthalpy losses while providing a highly uniform temperature for the hot side of the thermoelectric generators to operate at) enables the exploitation of a small combustion zone relative to the surface area of the thermoelectric modules. This configuration/methodology can enhance the system's fuel efficiency. The flow rate can be tuned to the geometry such that the thermoelectric modules reach their maximum allowable temperature at steady state and thus the TEG stack can be used as efficiently as possible.

Insulation (not shown) can be used to prevent heat loss from the sides of the casing 30, and to promote heat flow normal to the thermoelectric modules' surface area. This can increase the efficiency of the device 100 as well as to promote the homogeneous temperature across the working surface of the combustion casing 30 that the thermoelectric modules need.

The matrix stabilized combustion chamber 5 can have a cylindrical geometric shape, and include a porous material 10 to take advantage of the heat recirculation effect of combustion inside a porous media. This heat recirculation allows the device 100 to burn leaner mixtures of fuel and air that would not be possible in a non-porous chamber, as well as distribute the heat of combustion uniformly in the radial direction to the combustion chamber's casing 30. Its favorable heat transfer properties can also minimize heat lost in the form of enthalpy (i.e. a low exhaust temperature).

Figure 4:
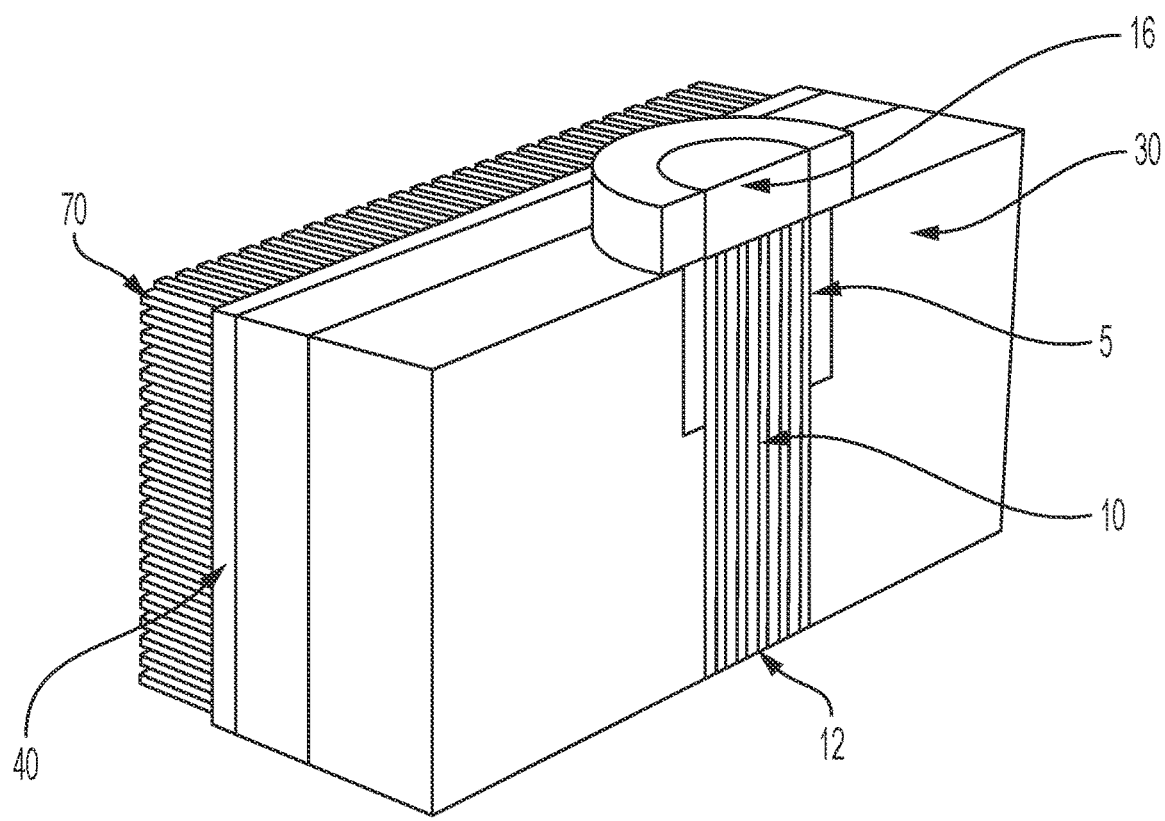
FIG. 4 is a perspective cross-sectional view taken along A-A shown in FIG. 2B of a heat sink/thermoelectric module (TEG) stack/combustion chamber casing assembly in accordance with an embodiment.

Referring to FIG. 4, in one embodiment, a perspective cross-sectional view taken along A-A shown in FIG. 2B of a heat sink/thermoelectric module (TEG) stack/combustion chamber casing assembly is shown. More particularly, heat sink 70 is positioned next to two thermoelectric module (TEG) stacks 40, which are also positioned next to combustion chamber casing 30 (which can be made of a thermally conductive material such as copper). The fuel-air mixture inlet 12 and exhaust outlet 16 are also shown. FIG. 4 also provides a view into the combustion chamber 5 including the porous burner with a matrix stabilized porous medium 10.

In accordance with an embodiment, the porous surface of the burner can be catalytically enhanced. The overall combustion reaction of the porous burner 10 can be described as consisting of two processes: one is fuel oxidation or release of the electrons and the second is oxidant reduction or acceptance of the electrons. If the proposed fuel is a simple $CH_4$ molecule then the activation energy to separate $CH_4$ into hydrogen atoms and hydrocarbon radicals, with further release of the electrons is lower (4.57 eV) than that of oxygen-oxygen bond in $O_2$ molecule (5.18 eV) as the covalent oxygen-oxygen bonding is very strong. However, if the catalysts would be used to promote $O_2$ molecule splitting, bond energy could be significantly decreased (1.5-2 eV), thus creating much more favorable conditions for combustion and facilitating the overall efficiency of the CHP system. Therefore, Applicant's determined that significant improvements in efficiency of superadiabatic combustion can be achieved by further exploring the most advanced catalytic ceramics, thus preferably avoiding expensive noble metals such as platinum or palladium. Both oxide and non-oxide ceramics can be used as a catalytic enhancement. Oxides such as $La_{0.6}Sr_{0.4}CoO_3$, $La_{0.7}Sr_{0.3}MnO_3$ and $CeO_2$-20 mol % $Gd_2O_3$ can be certain materials of choice. Other materials with certain catalytic properties to facilitate superadiabatic combustion, such as zirconium diboride ($ZrB_2$) and tungsten carbide (WC), can also be used.

Advantages of the invention are illustrated by the following Examples. However, the particular materials and amounts thereof recited in these examples, as well as other conditions and details, are to be interpreted to apply broadly in the art and should not be construed to unduly restrict or limit the invention in any way.

Example 1

This Example describes the depositing of catalytic enhancement on the porous burner with the matrix stabilized porous medium 10. The catalytic enhancement is deposited on the surfaces of $Al_2O_3$ and/or SiC reticulated foams which are typically catalytically inert and are used as a section to contain the flame and facilitate the combustion. All of the powders of the compositions of interest for the coating are used to coat the porous burner using the dip coating technique. In brief, dip coating is a very simple slurry coating technique which refers to a) immersing a sample (in this case porous ceramic matrix) into a tank, containing a slurry with a coating material; b) allowing the sample to remain in the slurry for a predetermined optimal time; c) removing the sample from the tank, placing the sample in the vacuum furnace and allowing the sample with coating to dry at 50-60° C. and $10^{-2}$ Pa for 2-3 hours. Dip coating is fairly straightforward and is the preferable technique for the purpose described herein, since the porous structure and its surface can be difficult to coat using other methods, such as spray deposition or sputter coating. Dip coating is used for homogenous porous coating with a high specific surface area strongly attached to the surface of the porous matrix. As a result, the coatings of different selected ceramic materials are deposited on the central part of the porous burner 10 for further use in the combustion chamber 5. Both deposited catalytically active coatings and inert surfaces of the porous burner can be characterized using micro-Raman spectroscopy and Scanning Electron Microscopy (SEM) techniques. The surfaces can be characterized both before the combustion reactions, to determine the quality of the surface, and after combustion, in order to detect changes, which would help to clarify how the material affected combustion.

Example 2

This Example describes the calculation of a theoretical power output of a thermoelectric power generator for powering small-scale electronic devices of an embodiment. By harvesting combustion heat from an ultra-efficient burner in a high-density manner using thermoelectric generators coupled with low-profile integrated fansink heat sinks, the thermoelectric power generator of an embodiment can provide an improved level of power density for portable-scale applications (i.e. powering a cell phone, small laptop, pump, fan, etc.) while maintaining an ample level of affordability.

The thermoelectric power generator's pertinent performance parameters are been listed in Table 1, below.

TABLE 1

| Theoretical system performance parameters | |
|---|---|
| Volumetric flow rate of fuel [L/min] | 1.41 |
| Maximum Net Power Output [W] | 17.3 |
| Maximum Net Power Density (tanks & unit) [W/ft$^3$] | 74.4 |
| Net Power Density (whole system) [W/ft$^3$] | 21.7 |
| Specific Power (tanks & unit) [mW/lbm] | 1,020 |
| Specific Power (whole system) [mW/lbm] | 785 |
| Energy Capacity [kJ] | 440 |
| Energy Density (tanks & unit) [kJ/ft$^3$] | 1,900 |
| Energy Density (whole system) [kJ/ft$^3$] | 553 |
| Specific Energy (tanks & unit) [J/lbm] | 25,900 |
| Specific Energy (whole system) [J/lbm] | 20,000 |
| Chem.-to-Elec. Efficiency [%] | 2.37 |
| Chem.-to-Therm. Efficiency [%] | 57.0 |

TABLE 1-continued

Theoretical system performance parameters

| | |
|---|---|
| Therm-to-Elec. Efficiency [%] | 4.16 |
| Run Time at Maximum Net Power (hrs) | 7.08 |
| Weight (tanks & unit) [lbf] | 17 |
| Weight (whole system) [lbf] | 22 |
| Volume (tanks & unit) [ft³] | 0.232 |
| Volume (whole system) [ft³] | 0.795 |

The performance parameters are theoretical values based upon temperature and flow rate measurements. In brief, the theoretical power output was calculated by referencing the figure of merit, zT, at the average measured temperature of each given thermoelectric module via an empirical plot provided on California Technological University's "The Science of Thermoelectric Materials," (Caltech Materials Science. Web. 26 Apr. 2012) for bismuth telluride ($Bi_2Te_3$) modules, shown in FIG. 5.

Figure 5:
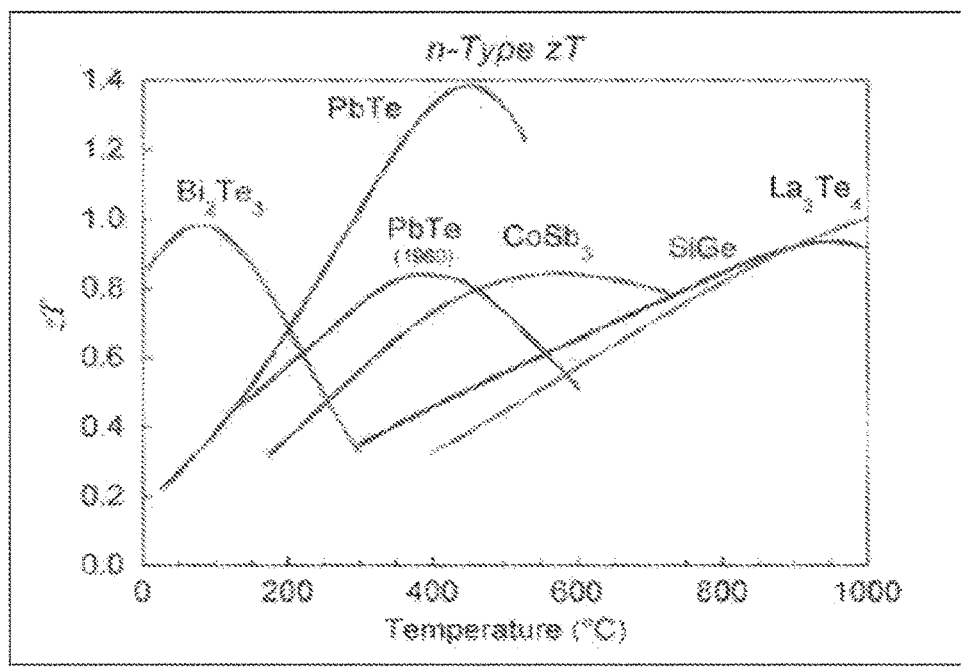
FIG. 5 is a graphical illustration of a plot showing the figure of merit, zT, for $Bi_2Te_3$ modules in accordance with an embodiment.

Referring to FIG. 5, in one embodiment, a graphical illustration of a plot showing the figure of merit, zT, for $Bi_2Te_3$ modules. From the figure of merit, each individual thermoelectric efficiency at matched load conditions, $\eta_{TEG}$, was calculated via Eq. 1 below, in which $\Delta T$ is the module's average temperature difference (calculated from the average hot side temperature, $T_H$, and the average cold side temperature of the given module).

$$\eta_{TEG} = \frac{\Delta T}{T_H} \cdot \frac{\sqrt{1+zT} - 1}{\sqrt{1+zT} + 1} \quad (1)$$

The theoretical net power output, $P_{theor}$, was calculated via Eq. 2, in which $q_{TEG}$ is the heat rate inputted into the given TEG and $P_{fan}$ is the power inputted into the fans (1.8 W) via a 5V external power supply outputting 0.36 A to the fans while in a parallel connection.

$$P_{net} = \eta_{TEG} q_{TEG} - P_{fan} \quad (2)$$

Porous Media Burner/Combustion Apparatus

A porous media burner/combustion apparatus 200 of an embodiment (as discussed in further detail in conjunction with Figures below) can operate on liquid logistic fuel, such as, but not limited to, diesel or kerosene, for the efficient production of useful heat. In order to begin operation, methane can be utilized as a primary ignition fuel, to heat up incoming reactants and provide a necessary thermal energy for liquid logistic fuel vaporization. Once a stable operating regime has been achieved, and the air which is forced into the vaporization zone exceeds a temperature characteristic of the boiling point of the liquid fuel being evaporated (i.e., which may be at least about 150° C. for higher boiling liquid logistic fuels as described above, but which may also be considerably lower for lower boiling liquid fuels such as but not limited to ethanol, gasohol and gasoline), the device can switch to liquid logistic fuel, allowing for the superadiabatic combustion to proceed.

Figure 6A:
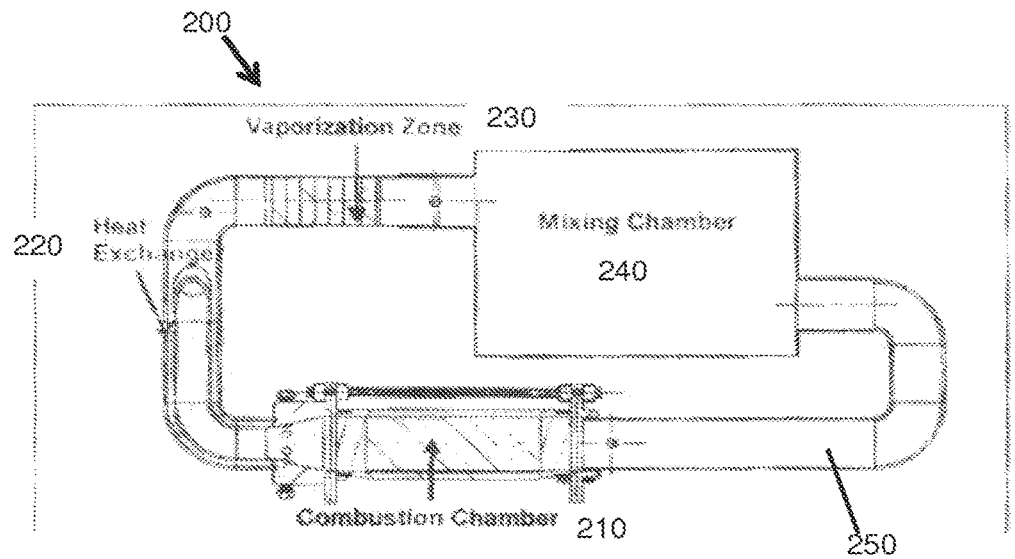
FIG. 6A is a top view schematic representation of a porous burner/combustion apparatus in accordance with an embodiment.
Figure 6B:
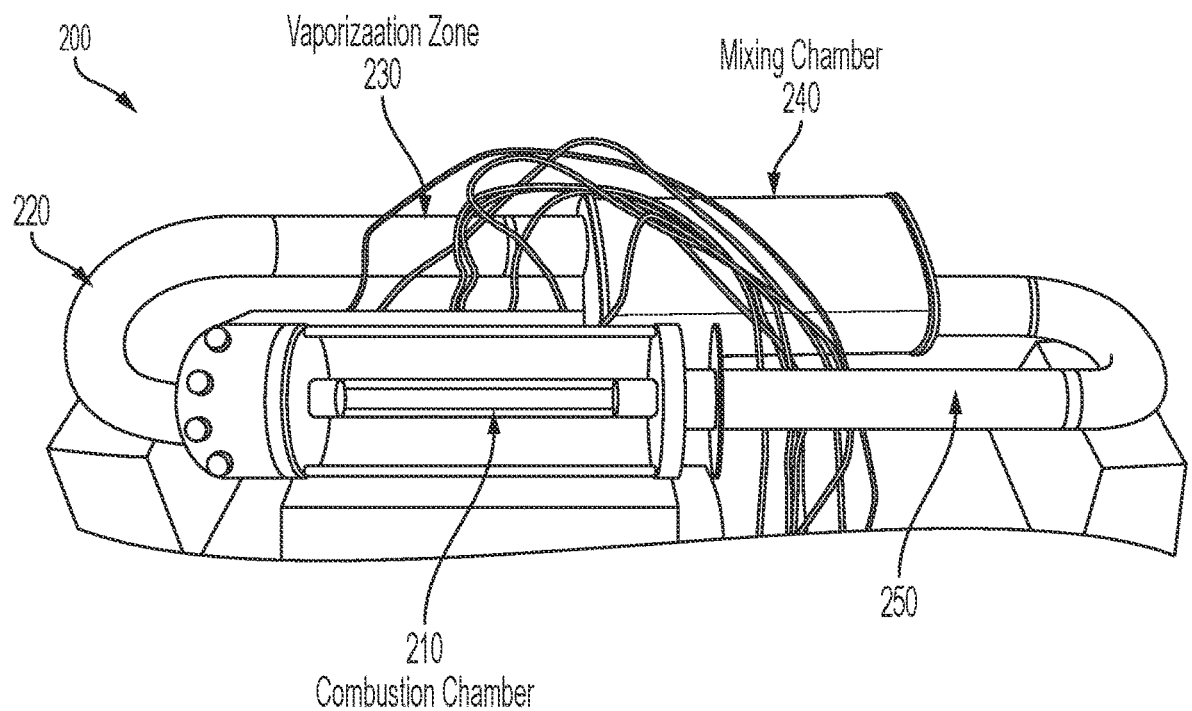
FIG. 6B is a photographic representation of a porous burner/combustion apparatus in accordance with an embodiment.

A schematic presentation of the porous burner/combustion apparatus of an embodiment is presented in FIG. 6A, and a photographic representation of the completed porous burner/combustion apparatus of an embodiment is presented in FIG. 6B. The porous media burner/combustion apparatus 200 of an embodiment can include, but is not limited to: (i) a combustion chamber 210 where superadiabatic combustion occurs inside of a porous media; (ii) a heat exchanger 220 where the generated heat is efficiently utilized to preheat incoming reactants; (iii) a liquid fuel vaporization zone 230 where the liquid fuel vaporizes; (iv) a mixing chamber 240 where the mixing of fuel and oxidizers (air) occurs; and (v) an interconnecting system 250 which transports the mixed oxidizer and fuel vapors from the mixing chamber to the combustion chamber. More particularly, in one embodiment, the combustion chamber 210 can include a porous combustion material including a catalytic material including, but not limited to, (1) $OsB_2$, $IrB_2$, $ReB_2$, $OsB_{12}$, $ReB_{12}$, $IrB_{12}$ and their solid solutions; (2) $AlMgB_{14}$, $AlCrB_{14}$, $AlCoB_{14}$, $AlMnB_{14}$ and their solid solutions; (3) WB4; and (5) oxide ceramics such as $La_{0.6}Sr_{0.4}Cr_{0.7}Mg_{0.25}NiO_{3.0}$ perovskites. The "porous combustion material" within an apparatus in accordance with the embodiments may not be consumed by a thermal combustion reaction, but rather can act as a device which supplies the necessary energy for ignition to the reactant flow stream.

Figure 7A:
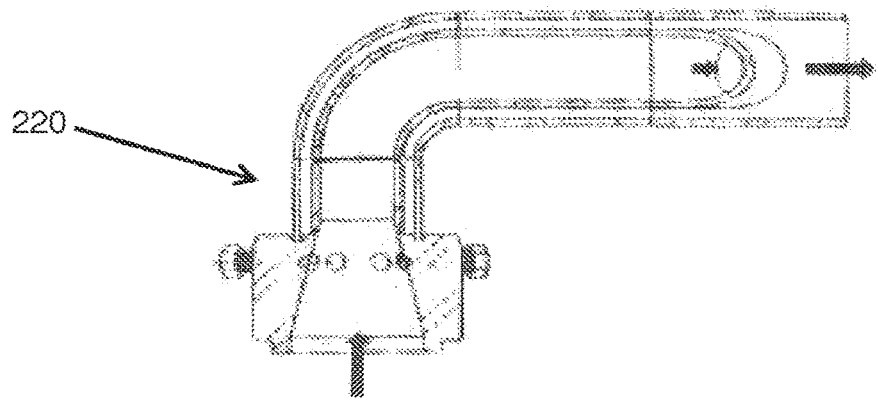
FIG. 7A is a 2D model schematic representation of a heat exchanger in accordance with an embodiment.
Figure 7B:
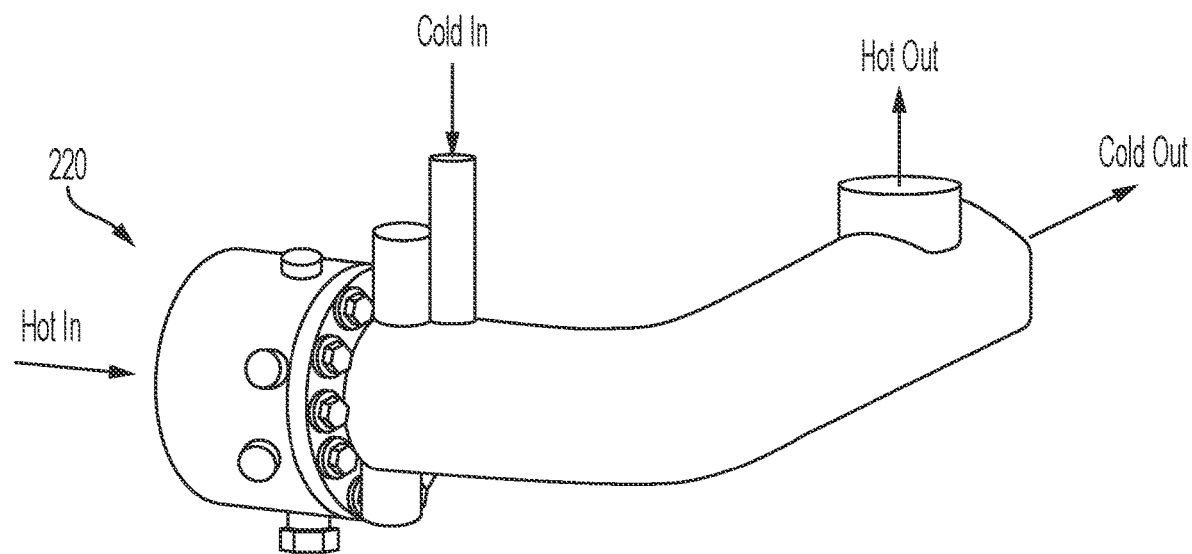
FIG. 7B is a 3D model schematic representation of a heat exchanger in accordance with an embodiment.

More particularly, in one embodiment, the integrated heat exchanger 220, can make use of latent exhaust heat to preheat incoming gaseous reactants for the duration of operation. The preheating allows a greater effective use of liquid logistic fuel as its vaporization takes place prior to crossing the boundary of the combustion reaction. By design, exhaust gasses also exit the burner through the heat exchanger 220. Experiments have shown that with an inlet temperature of 425° C. at the hot side, for example, incoming gasses would have come to the vaporization zone 230 having reached a temperature of 150° C., which would be sufficient to promote an efficient liquid logistic fuel vaporization. See FIG. 7A for a 2D model schematic representation of the heat exchanger 220; and FIG. 7B for a 3D model schematic representation of the heat exchanger 220.

The vaporization zone 230, where liquid logistic fuel is delivered to the system, makes use of the preheated air to vaporize the liquid logistic fuel, in conjunction with high specific surface area metallic porous foam. The vaporization can be achieved through the intended convective heating of the metallic porous foam. Liquid logistic fuel is dripped onto this foam through the use of steel needles and evaporates from within the porous mesh as a result of the high temperatures. The use of the porous foam allows fuel to evenly spread over a large area increasing the vaporization rate of the liquid fuel. See FIG. 8A for a 2D model schematic representation of the vaporization zone 230; and FIG. 8B for a photographic representation of the vaporization zone 230. The thickness of each porous section can be about 0.5" and can have a diameter of about 1.875".

Figure 9A:
FIG. 9A is a 2D model schematic representation of the mixing chamber in accordance with an embodiment.
Figure 9B:
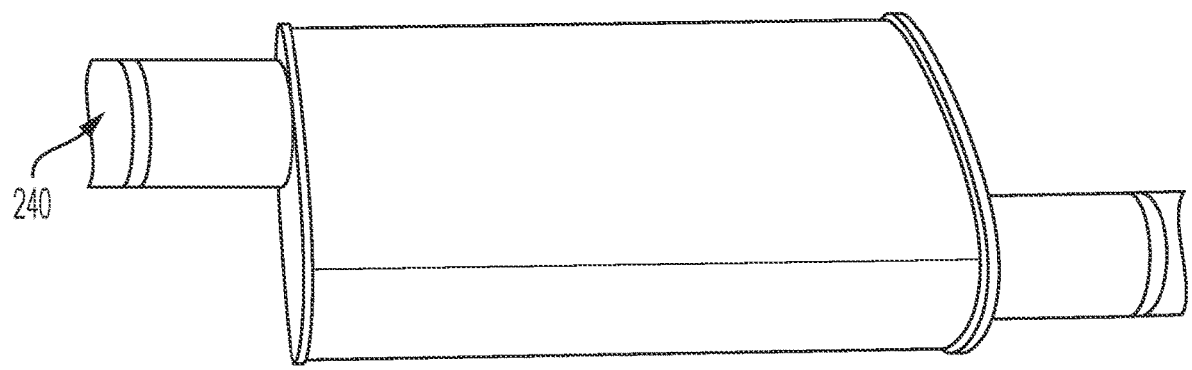
FIG. 9B is a photographic representation of a mixing chamber in accordance with an embodiment.

The mixing chamber 240 can ensure that the fuel vapors and air vapors are mixed well and become homogeneously distributed within the volume. The mixing process can create a more favorable environment for combustion to occur, as the gradient of entropy generation is spread over a longer time period. See FIG. 9A for a 2D model schematic representation of the mixing chamber 240; and FIG. 9B for a photographic representation of the mixing chamber 240.

The external dimensions of the mixing chamber 240 can be about 11.5" in length and about 8.5" wide.

Figure 10A:
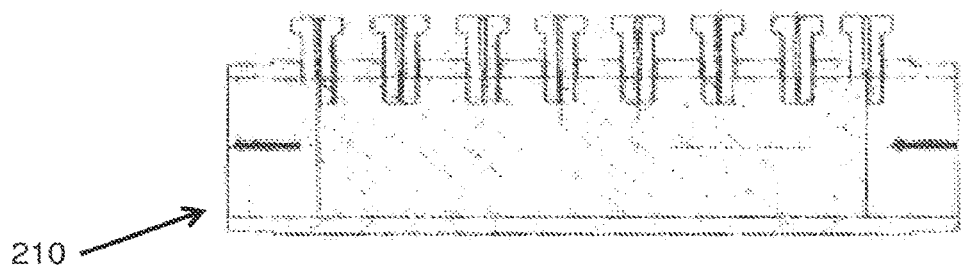
FIG. 10A is a 2D model schematic representation of the combustion chamber in accordance with an embodiment.
Figure 10B:
FIG. 10B is a photographic representation of a combustion chamber in accordance with an embodiment.

The combustion chamber 210 can have several features, including but not limited to: thermocouple ports; porous media for the combustion reaction; flame arrestors which utilize honeycomb ceramics; porous ceramic combustion; and a quam viewing window. The thermocouple ports deliberate placement allows for an accurate gauging of the flame's location and temperature measurements as well as a necessary data set for further calculations. See FIG. 10A for a 2D model schematic representation of the combustion chamber 210; and FIG. 10B for a photographic representation of the combustion chamber 210. The overall length of the combustion chamber 210 can be about 8" with an internal diameter of about 2". About one inch of the ceramic honeycomb can be devoted at each end, with the foam for operation of the flame being about 6" in length.

Combustion of the porous burner/combustion apparatus 200 of an embodiment with thermoelectric devices can provide a benefit in the form of the simultaneous generation of both useful heat and electric power. Using radiative heat extraction, which may be made possible from an optical viewport on a porous burner/combustion apparatus 200 in accordance with an embodiment; a flat plate can be made to collect the heat emitted from the combustion reaction which can allow the burner to function as a stove. A porous burner/combustion apparatus 200 of an embodiment can heat a space through two methods. A first method can use radiation directly to heat a specific space, and a second method can use an extended surface placed upon the combustion chamber allowing heat to convectively enter the space. By placing a specially designed heat exchanger onto a combustion chamber view port of an apparatus in accordance with the embodiments, radiative energy can be used to heat up water. Simultaneously a heat exchanger in accordance with an apparatus in accordance with the embodiments may also be fitted onto an exhaust stream at a system exit allowing for a convective gas-liquid heat exchanger to be implemented within an apparatus in accordance with the embodiments.

While several embodiments of the invention have been discussed, it will be appreciated by those skilled in the art that various modifications and variations of the present invention are possible. Such modifications do not depart from the spirit and scope of the present invention.

What is claimed is:

1. A porous media burner combustion apparatus, comprising:
   a combustion chamber for receiving a fuel and an oxidant having a bond energy, wherein the combustion chamber is formed by a porous combustion facilitating material that has a surface coated with a catalytic material that can lower the bond energy of the oxidant, wherein the catalytic material is selected from the group consisting of $La_uSr_vCr_wMg_xNi_yO_z$ ceramic materials, where u equals 0.6 to 0.8, v equals 0.2 to 0.4, w equals 0.7 to 0.8, x equals 0.195 to 0.295, y equals 0.001 to 0.005 and z equals 2.95 to 3.05.

2. The combustion apparatus of claim 1, wherein the combustion apparatus comprises a portable stove.

3. The combustion apparatus of claim 1, wherein the combustion apparatus comprises a portable space heater.

4. The combustion apparatus of claim 1, wherein the combustion apparatus comprises a Stirling engine.

5. The combustion apparatus of claim 1, wherein the combustion apparatus comprises an Organic Rankine Cycle.

6. The combustion apparatus of claim 1, wherein the combustion apparatus comprises a portable water heater.

\* \* \* \* \*